(12) United States Patent
Chu et al.

(10) Patent No.: US 7,911,748 B1
(45) Date of Patent: Mar. 22, 2011

(54) DIFFUSION CAPACITOR FOR ACTIVELY TRIGGERED ESD CLAMP

(75) Inventors: Charles Chu, Diamond Barr, CA (US); Marcel Terbeek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 484 days.

(21) Appl. No.: 11/517,073

(22) Filed: Sep. 7, 2006

(51) Int. Cl.
    *H02H 3/22* (2006.01)
(52) U.S. Cl. ............................................. 361/56; 361/11
(58) Field of Classification Search .................. 361/56, 361/91.1, 111; 257/355–360
    See application file for complete search history.

(56) References Cited

U.S. PATENT DOCUMENTS

| | | | | |
|---|---|---|---|---|
| 5,173,755 | A * | 12/1992 | Co et al. | 257/361 |
| 6,618,230 | B2 * | 9/2003 | Liu et al. | 361/56 |
| 2006/0027219 | A1 * | 2/2006 | Ando | 123/618 |
| 2006/0209479 | A1 * | 9/2006 | Grombach et al. | 361/56 |

* cited by examiner

*Primary Examiner* — Danny Nguyen
(74) *Attorney, Agent, or Firm* — Jurgen K. Vollrath; Vollrath & Associates

(57) ABSTRACT

In an actively triggered ESD protection structure, the control electrode is triggered by an RC circuit, wherein the capacitor is a diffusion capacitor implemented as one or more forward or reverse biased p-n junctions.

16 Claims, 1 Drawing Sheet

DIFFUSION CAPACITOR FOR ACTIVELY TRIGGERED ESD CLAMP

FIELD OF THE INVENTION

The invention relates to actively triggered Electrostatic Discharge (ESD) clamps. In particular it relates to RC circuits for realizing an RC time constant for active ESD clamps.

BACKGROUND OF THE INVENTION

Integrated circuits that include MOS transistors are particularly susceptible to damage by electrostatic discharge (ESD) events, e.g. when the circuit is touched by a person handling the circuit causing static electricity to discharge from the handler through the circuit. This is particularly the case once the circuit has been packaged but prior to it being installed in a product.

Different protection circuits have been developed to deal with ESD events, one of these involving the use of BJT or MOS transistors or SCR devices that shunt ESD current to ground. In order to control the turn-on of the shunt, the gate electrode of the shunt may be controlled. This may involve biasing the gate electrode using a forward biased diode or a reverse biased Zener diode. One such prior art control circuit is shown in FIG. 1, which includes a diode 100 controlling the gate of a BJT 102. In the case of an ESD event to the VDD rail, a voltage peak is produced over the diode 100 and resistor 104. When the diode 100 turns on (at about 1 V over the diode) it provides a bias voltage to the gate of the BJT 102 as defined by the voltage over the resistor 104. The BJT 102 in this case acts as a shunt operating in snapback mode or in normal mode to shunt current from the pad 104 to ground in the event of an ESD event. Another prior art device is shown in FIG. 2, which shows a Zener diode 200 controlling an NMOS device 202. A typical reverse biased Zener diode such as Zener 202 will turn on at about 15V, thus the Zener 202 will provide a gate bias voltage to the NMOS device as dictated by the voltage over the resistor 204.

Instead of using a control or trigger circuit such as the diode 100 or zener diode 200 to provide the gate bias voltage by means of a resistor, another prior art approach involves the use of a resistor-capacitor (RC) circuit. One such circuit is shown in FIG. 3. This circuit comprises an RC circuit as defined by a capacitor 300 and a resistor 302. The RC circuit controls the triggering of an NMOS device 304 as is discussed in greater detail below. During normal operation, the junction breakdown of the NMOS snapback device 304 is greater than VDD. Thus VDD will simply charge up the capacitor 300 and hold the node 306 at VDD. The node voltage is inverted by the inverter 310 which applies the resultant low voltage to the substrate and gate of the NMOS 304, thereby ensuring that the junction breakdown of the NMOS is not affected and the NMOS does not trigger. The time constant of the RC circuit is typically chosen to be about 1 to 10 µs. In contrast, the impulse at power on has a duration of the order of milliseconds. Thus, the much shorter time constant of the RC circuit allows zero volts to be is applied to the substrate and gate of the NMOS 304 virtually instantaneously, causing little leakage. An ESD event across the power line VDD and ground, on the other hand, has a much shorter duration than the RC time constant, being of the order of several nanoseconds. Thus the capacitor 300 will not be able to respond in time to the large ESD voltage peak. This causes the node 306 to be substantially grounded, causing an increased gate driving voltage and substrate triggering voltage. This reduces the breakdown voltage of the NMOS 304 and causes it to go into snapback mode, thereby shunting ESD current to ground. The problem with this configuration is that as CMOS processes continue to advance, e.g., 90 nm geometry, the gate oxide becomes increasingly leaky, therefore any capacitors that include a gate oxide will leak under normal operation. In fact the leakage current through a capacitor that includes a gate oxide can be as much as the current through the resistor. Thus it is difficult to realize a good RC time constant for an RC trigger circuit. The present invention seeks to address this issue.

SUMMARY OF THE INVENTION

According to the invention there is provided a capacitor for a trigger circuit that comprises a diffusion capacitor. This can be implemented as a reverse-biased p-n junction or a forward biased p-n junction.

The junction capacitance of a reverse biased junction is very well characterized and can therefore be scaled accordingly. This type of capacitor offers a reverse leakage of the order of nano Amps. A forward biased junction offers an attractive alternative, especially at low voltages. Most advanced processes use low voltages, e.g. 1.2 V and below, thus allowing a stacked forward biased junction capacitor to be used. Since capacitance increases as it nears forward turn-on, the forward biased junction capacitor has the advantage of allowing capacitor size to be reduced.

According to the invention, there is provided a method of controlling the turn-on of an ESD protection device having a control electrode, including connecting the control electrode to an RC (resistor-capacitor) circuit, wherein the capacitor of the RC circuit comprises a diffusion capacitor. The diffusion capacitor may be defined by a reverse-biased p-n junction or a forward biased p-n junction. The reverse-biased p-n junction may implemented by a Zener diode and the forward biased junction may be implemented by one or more diodes. The RC circuit typically has a time constant of 1 to 10 µs. The breakdown voltage of the one or more p-n junctions is typically higher than the breakdown voltage of the gate oxide of the ESD protection structure, which may comprise an NMOS transistor.

Further according to the invention, there is provided An actively triggered ESD clamp, comprising an ESD protection device having a control electrode defined by a gate formed on an oxide layer, and an RC circuit connected to the control electrode, wherein the RC circuit comprises a diffusion capacitor implemented by at least one p-n junction, said at least one p-n junction having a higher breakdown voltage than the breakdown voltage of the gate oxide of the ESD protection device.

DETAILED DESCRIPTION OF THE INVENTION

The present invention proposes an ESD protection circuit that includes a shunt and a trigger circuit or control circuit in the form of an RC circuit. In accordance with the invention, the capacitor of the RC circuit is defined by a diffusion capacitor. In particular, the present invention proposes forming a forward or reverse biased p-n junction (a junction between positively doped and negatively doped regions) which may include a physical junction between p+ material and n+ material or may involve p+ and n+ regions formed in a well or substrate of p-type of n-type material, and separated from each other. In the latter case the junction is thus essentially between a highly doped region of one doping type and a well or substrate of opposite doping type, in which is formed a highly doped region of the opposite doping type.

Figure 4:
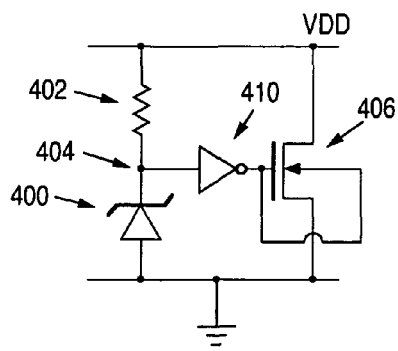
FIG. 4 is a circuit diagram of one embodiment of the invention.

One embodiment of the invention is shown in FIG. 4, which makes use of a reverse biased junction as depicted by Zener diode 400 to define a diffusion capacitor of an RC circuit. The resistor of the RC circuit is indicated by reference numeral 402. The node 404 between the Zener diode 400 and resistor 402 is connected to the gate of a shunt, which in this embodiment takes the form of an NMOS transistor 406. The NMOS transistor 406 of the present embodiment operates in snapback mode, therefore gate biasing simply helps control the triggering voltage of the NMOS transistor 406.

Figure 1:
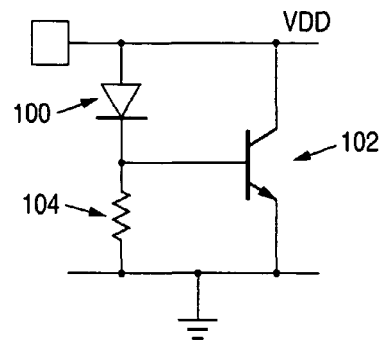
FIG. 1 is a circuit diagram of a prior art ESD protection circuit.
Figure 2:
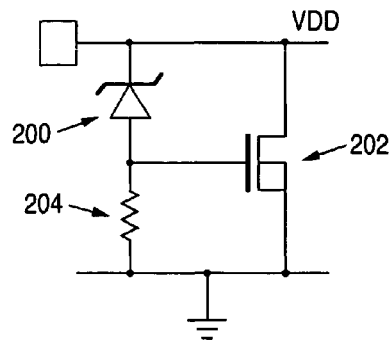
FIG. 2 is a circuit diagram of another embodiment of a prior art ESD protection circuit, FIG. 3 a circuit diagram of yet another prior art ESD protection circuit.
Figure 3:
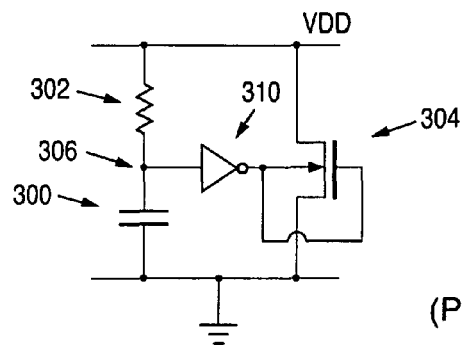

While, at a circuit level the ESD protection circuit of FIG. 4 is similar to that of FIG. 2, the dimensions of the Zener diode are chosen to provide a diffusion capacitor of the desired capacitance. The reverse biased junction capacitance is well characterized and can therefore readily be scaled to meet the time constant requirements of the RC circuit as defined by the diffusion capacitor 400 and resistor 402. In one embodiment, instead of adjusting capacitance parameters, the resistance of resistor 402 is chosen, instead to provide the desired time constant for the RC circuit. The RC circuit in this embodiment is chosen in much the same way as an RC circuit of the prior art, namely to have a time constant that is of the order of about 1 to 10 µs. During normal operation, the junction breakdown of the NMOS snapback device 406 is greater than VDD. Thus VDD will simply charge up the diffusion capacitor 400 and hold the node 404 at VDD. The node voltage is inverted by the inverter 410 which applies the resultant low voltage to the substrate and gate of the NMOS 406, thereby ensuring that the junction breakdown of the NMOS is not affected and the NMOS does not trigger. In contrast to the time constant of the RC, which is chosen to be about 1 to 10 µs, the impulse at power on has a duration of the order of milliseconds. Thus, the much shorter time constant of the RC circuit allows zero volts to be applied to the substrate and gate of the NMOS 406 virtually instantaneously, causing little leakage. An ESD event across the power line VDD and ground, on the other hand, has a much shorter duration than the RC time constant, being of the order of several nanoseconds. Thus the capacitor 400 will not be able to respond in time to the large ESD voltage peak. This causes the node 404 to be substantially grounded, causing an increased gate driving voltage. This turns on the NMOS, which operates in normal mode.

It will be appreciated that the embodiments of the present invention are distinguishable over the prior art use of Zeners and forward biased diodes by the fact that in the prior art the breakdown voltage of the Zener or diode is the important consideration while in the present invention the diode or Zener is kept in conduction and breakdown is avoided. Instead the junction capacitance of the Zener or diode is the parameter that is important in defining a desired time constant for an RC circuit. This is important in advanced processes where the gate oxide breakdown voltage is low such that the Zener breakdown voltage is in fact higher than the gate oxide breakdown voltage.

Figure 5:
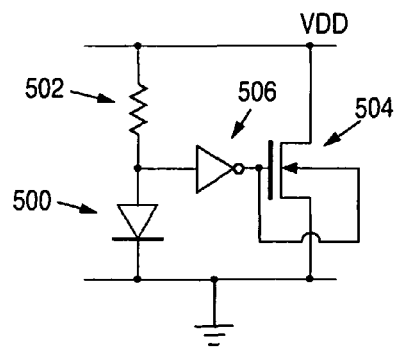
FIG. 5 is a circuit diagram of another embodiment of the invention.

As mentioned above, the diffusion capacitor can instead be defined by a forward biased junction, as shown in FIG. 5. In this embodiment the forward biased junction is formed by a diode 500. Again, the diffusion capacitance of the forward biased junction is well classified and an RC circuit can be formed with a resistor 502 to provide a good time constant of 1 to 10 µs. The rest of the ESD protection circuit is similar to that of FIG. 4, and includes an NMOS shunt 504 connected with its gate and substrate through an inverter 506 to the RC circuit defined by the resistor 502 and diffusion capacitor of the diode 500.

While the invention has been described with respect to specific embodiments it is not so limited and can be implemented in different ways and with different types of clamps, e.g. Merrill clamps and FET clamps, without departing from the scope of the invention as defined by the claims.

What is claimed is:

1. A method of controlling the turn-on of an ESD protection
device having a control electrode, including
connecting the control electrode of the ESD protection device to an RC circuit, wherein the capacitor of the RC circuit comprises a diffusion capacitor having a breakdown voltage that is higher than the breakdown voltage of the ESD protection device.

2. A method of claim 1, wherein the diffusion capacitor is defined by a reverse-biased p-n junction.

3. A method of claim 1, wherein the diffusion capacitor is defined by a forward biased p-n junction.

4. A method of claim 2, wherein the reverse-biased p-n junction is defined by a Zener diode.

5. A method of claim 3, wherein the forward biased junction is defined by a diode.

6. A method of claim 2, wherein the breakdown voltage of the p-n junction is higher than the gate oxide breakdown voltage of the ESD protection device.

7. A method of claim 6, wherein the ESD protection device is an NMOS transistor.

8. A method of claim 1, wherein the RC circuit has a time constant of 1 to 10 µs.

9. A method of claim 6, wherein the RC circuit has a time constant of 1 to 10 µs.

10. A method of claim 3, wherein the breakdown voltage of the p-n junction is higher than the gate oxide breakdown voltage of the ESD protection device.

11. A method of claim 10, wherein the diffusion capacitor is implemented as multiple forward biased p-n junctions.

12. An actively triggered ESD clamp, comprising
an ESD protection device having a control electrode defined by a gate formed on an oxide layer, and
an RC circuit connected to the control electrode, wherein the RC circuit comprises a diffusion capacitor implemented by at least one p-n junction, said at least one p-n junction having a higher breakdown voltage than the breakdown voltage of the gate oxide of the ESD protection device.

13. A clamp of claim 12, wherein the ESD protection device includes an NMOS transistor.

14. A clamp of claim 12, wherein the RC circuit has a time constant of 1 to 10 µs.

15. A clamp of claim 14, wherein the p-n junction is defined by a forward biased diode.

16. A clamp of claim 14, wherein the p-n junction is defined by a reverse biased Zener diode.

* * * * *